US009530807B2

(12) United States Patent
Li et al.

(10) Patent No.: US 9,530,807 B2
(45) Date of Patent: Dec. 27, 2016

(54) THIN FILM TRANSISTOR ARRAY SUBSTRATE, MANUFACTURING METHOD THEREOF, AND DISPLAY DEVICE

(71) Applicant: Beijing BOE Optoelectronics Technology Co., Ltd., Beijing (CN)

(72) Inventors: Tiansheng Li, Beijing (CN); Wenyu Zhang, Beijing (CN); Zhenyu Xie, Beijing (CN)

(73) Assignee: Beijing BOE Optoelectronics Technology Co., Ltd., Beijing (CN)

( * ) Notice: Subject to any disclaimer, the term of this patent is extended or adjusted under 35 U.S.C. 154(b) by 516 days.

(21) Appl. No.: 13/993,666

(22) PCT Filed: Dec. 10, 2012

(86) PCT No.: PCT/CN2012/086307
§ 371 (c)(1),
(2) Date: Jun. 12, 2013

(87) PCT Pub. No.: WO2013/166831
PCT Pub. Date: Nov. 14, 2013

(65) Prior Publication Data
US 2014/0061645 A1      Mar. 6, 2014

(30) Foreign Application Priority Data

May 11, 2012   (CN) .......................... 2012 1 0146750

(51) Int. Cl.
*H01L 27/12* (2006.01)
*H01L 29/786* (2006.01)
(Continued)

(52) U.S. Cl.
CPC ..... *H01L 27/1288* (2013.01); *G02F 1/134363* (2013.01); *H01L 27/124* (2013.01);
(Continued)

(58) Field of Classification Search
None
See application file for complete search history.

(56) References Cited

U.S. PATENT DOCUMENTS 7,053,972 B2 *   5/2006   Lim .................. G02F 1/136227
                                          349/151
7,211,944 B2 *   5/2007   Bae .................... H01L 27/3253
                                          257/40
(Continued)

FOREIGN PATENT DOCUMENTS

CN          1420554 A       5/2003
CN          1452002 A      10/2003
(Continued)

OTHER PUBLICATIONS

PCT International Search Report for International Application No. PCT/CN2012/086307, dated Dec. 10, 2012; 16 pages.
(Continued)

*Primary Examiner* — Anthony Ho
*Assistant Examiner* — Kevin Quinto

(57) ABSTRACT

A thin film transistor (TFT) array substrate, a manufacturing method thereof and a display device are provided. The manufacturing method comprises: forming a first passivation layer (8) on a substrate (1), and forming a board wiring PAD-region via hole (11) in the first passivation layer (8) above the board wiring PAD region (11) through a first patterning process; forming a second passivation layer (16) on the substrate (1) formed with the board wiring PAD-region via hole (11), and forming a pixel-region via hole (15) in the first passivation layer (8) and the second passivation layer (16) above the display electrode (7) through a second patterning process in such a way that the pixel-region via hole (15) has a top-size smaller than its bottom-size; and applying a transparent conductive layer on the substrate (1)
(Continued)

formed with the pixel-region via hole (15) to form a second display electrode.

13 Claims, 9 Drawing Sheets

(51) Int. Cl.
*H01L 33/36* (2010.01)
*G02F 1/1343* (2006.01)
*G02F 1/1337* (2006.01)

(52) U.S. Cl.
CPC .......... *H01L 29/786* (2013.01); *H01L 33/36* (2013.01); *G02F 1/133707* (2013.01); *G02F 2001/134318* (2013.01)

(56) References Cited

U.S. PATENT DOCUMENTS

| | | | |
|---|---|---|---|
| 2003/0123001 A1* | 7/2003 | Ha | G02F 1/136227 349/113 |
| 2003/0193626 A1 | 10/2003 | Lim | |
| 2005/0127825 A1 | 6/2005 | Bae et al. | |
| 2006/0006385 A1* | 1/2006 | Park | G02F 1/13458 257/59 |
| 2008/0158457 A1 | 7/2008 | Park et al. | |
| 2009/0081820 A1 | 3/2009 | Park et al. | |
| 2010/0007836 A1 | 1/2010 | Lee | |

FOREIGN PATENT DOCUMENTS

| | | |
|---|---|---|
| CN | 1509128 A | 6/2004 |
| CN | 101127357 A | 2/2008 |
| CN | 101211084 A | 7/2008 |
| CN | 101393897 A | 3/2009 |
| CN | 101625491 A | 1/2010 |
| CN | 101651232 A | 2/2010 |
| CN | 101833204 A | 9/2010 |
| CN | 102709241 A | 10/2010 |
| KR | 20030083080 A | 10/2003 |

OTHER PUBLICATIONS

English Abstract of CN101833204A (listed above under Foreign Patent Documents); 1 page.
English Abstract of CN1452002A (listed above under Foreign Patent Documents); 1 page.
English Abstract of CN101127357A (listed above under Foreign Patent Documents); 1 page.
English Abstract of CN101651232A (listed above under Foreign Patent Documents); 1 page.
English Abstract of CN102709241A (listed above under Foreign Patent Documents); 1 page.
The State Intellectual Property Office of the People's Republic of China ("SIPO") (Chinese language) First Office Action issued on Sep. 24, 2013 by SIPO in Chinese Patent Application 201210146750.0; Six (6) pages.
English Translation of the State Intellectual Property Office of the People's Republic of China ("SIPO") (Chinese language) First Office Action issued on Sep. 24, 2013 by SIPO in Chinese Patent Application 201210146750.0; Five (5) pages.
The State Intellectual Property Office of the People's Republic of China ("SIPO") (Chinese language) Second Office Action issued on Jan. 9, 2014 by SIPO in Chinese Patent Application 201210146750.0; Nine (9) pages.
English Translation of the State Intellectual Property Office of the People's Republic of China ("SIPO") (Chinese language) Second Office Action issued on Jan. 9, 2014 by SIPO in Chinese Patent Application 201210146750.0; Eight (8) pages.
English Abstract of CN101393897A (listed above under Foreign Patent Documents); 1 page.
English Abstract of CN1420554A (listed above under Foreign Patent Documents); 1 page.
English Abstract of CN1509128A (listed above under Foreign Patent Documents); 1 page.
English Abstract of CN101211084A (listed above under Foreign Patent Documents); 2 pages.
English Abstract of KR20030083080A (listed above under Foreign Patent Documents); 2 pages.
English Abstract of CN101625491A (listed above under Foreign Patent Documents); 1 page.
The State Intellectual Property Office of the People's Republic of China ("SIPO") (Chinese language) Rejection Decision issued on May 6, 2014 by SIPO in Chinese Patent Application 201210146750.0; Seven (7) pages.
English Translation of the State Intellectual Property Office of the People's Republic of China ("SIPO") (Chinese language) Rejection Decision issued on May 6, 2014 by SIPO in Chinese Patent Application 201210146750.0; Nine (9) pages.
PCT International Preliminary Examination Report in International Application No. PCT/CN2012/086307, dated Nov. 11, 2014; 11 pages.
The State Intellectual Property Office of the People's Republic of China ("SIPO") (Chinese language) Notification of Reexamination issued on Jan. 16, 2015 by SIPO in Chinese Patent Application 2012101467500. Eight (8) pages.
English Translation of the State Intellectual Property Office of the People's Republic of China ("SIPO") Notification of Reexamination issued on Jan. 16, 2015 by SIPO in Chinese Patent Application 2012101467500. Eleven (11) pages.

* cited by examiner

THIN FILM TRANSISTOR ARRAY SUBSTRATE, MANUFACTURING METHOD THEREOF, AND DISPLAY DEVICE

CROSS REFERENCE TO RELATED APPLICATIONS

This application is based on International Application No. PCT/CN2012/086307 filed on Dec. 10, 2012, which claims priority to Chinese National Application No. 201210146750.0 filed on May 11, 2012, the contents of which are incorporated herein by reference.

FIELD OF THE INVENTION

Embodiments of the present invention relate to a thin film transistor array substrate, a manufacturing method thereof, and a display device.

BACKGROUND OF THE INVENTION

In recent years, with the advancement of science and technology, digital televisions begin to be incorporated into daily life. Thin Film Transistor Liquid Crystal Displays (TFT-LCDs) become currently dominant products for their features of small sizes, low power consumption, being free of radiation and high resolution.

At present, a wide-viewing high-transmittance flat-panel display technology comprises: Advanced Super Dimension Switch (ADSDS, simply referred to as ADS) and In-plane Switching (IPS). ADS technology, by utilizing a multi-dimensional electric field, constituted by an electric field generated from edges of slit-electrodes in a same plane and an electric field generated between a slit-electrode layer and a plate-like electrode layer, enables liquid crystal molecules in all orientations between the slit-electrodes and over the electrodes within a liquid crystal cell to rotate, thereby improving work efficiency of the liquid crystal and increasing light transmission efficiency. ADS technology can improve image quality of a TFT-LCD product, makes it have advantages of high resolution, high transmittance, low power consumption, wide viewing angle, high aperture ratio, low chromatic aberration, and being free of push Mura, etc.

As an improved ADS technology, HADS (High transmittance—Advanced Super Dimension Switch) technology has a higher light transmittance, contrast, and a wider viewing angle; therefore, HADS technology has a very broad prospect. As illustrated in FIG. 1(a) and FIG. 1(b), a structure of an existing HADS-type TFT-LCD array substrate mainly comprises: a substrate 1, a gate scan line 13, a thin film transistor (TFT), a data line 14, a pixel electrode 7 (equivalent to the plate-like electrode), a board wiring PAD region 10, a via hole 11 and a common electrode 9 (equivalent to the slit-electrode). The TFT-LCD array substrate is accomplished through several times of patterning process, in which each patterning process respectively comprises masking, exposing, developing, etching and removing, etc.; a specific manufacturing method of the TFT-LCD array substrate comprises the following steps. Patterns of a gate electrode 2 and a gate scan line 13 are formed on a substrate 1; a gate insulating layer 3 is formed on the gate electrode 2 and the gate scan line 13, and then a pattern of an active layer 4 is formed on the gate insulating layer 3; then, a pixel electrode 7, a source electrode 5, a drain electrode 6 and a data line 14 are sequentially formed, and the drain electrode 6 are in direct contact with the pixel electrode 7; a passivation layer 8 is deposited on the above-described patterns, and a pattern of via hole 11 on a board wiring PAD region 10 is formed through a patterning process; thereafter, a common-electrode metal is deposited, and a pattern of a common electrode 9 with a comb-like slim structure is formed through a patterning process.

In the procedure of forming the pattern of the common electrode 9 with a comb-like slim structure (i.e., a slit-structure) through a patterning process, wet etch is usually adopted. Thus, due to the influence of some factors, for example, the deposited ITO-electrode metal being too thick, or the base substrate having defects, the part of the ITO-electrode metal that is not covered with photoresist may not be completely etched off by the etching liquid, which eventually leads to residues of electrodes. Thus, a uniform pattern of comb-like electrode cannot be formed, so that an uneven screen image is displayed, which seriously affects the yield and costs of array substrates.

SUMMARY OF THE INVENTION

An embodiment of the present invention provides a manufacturing method of a thin film transistor array substrate, and the method comprises: forming a first passivation layer on a substrate formed with a gate scan line, a thin film transistor, a data line, a first display electrode and a board wiring PAD region, and forming a board wiring PAD-region via hole in the first passivation layer above the board wiring PAD region through a first patterning process; forming a second passivation layer on the substrate formed with the board wiring PAD-region via hole, and forming a pixel-region via hole in the first passivation layer and the second passivation layer above the first display electrode through a second patterning process in such a way that the pixel-region via hole has a top-size smaller than its bottom-size; and applying a transparent conductive layer on the substrate formed with the pixel-region via hole to form a second display electrode.

Another embodiment of the present invention provides a thin film transistor array substrate, which comprises: a substrate; a gate scan line, a thin film transistor, a data line, a pixel electrode, a common electrode, a board wiring PAD region and a PAD-region via hole formed on the substrate, wherein a passivation layer between the pixel electrode and the common electrode has a pixel-region via hole formed therein, wherein the passivation layer comprises a first passivation layer and a second passivation layer, and the pixel-region via hole has a top-size smaller than its bottom-size.

Yet another embodiment of the present invention provides a display device, comprising an array substrate in accordance with any embodiment of the present invention.

BRIEF DESCRIPTION OF THE DRAWINGS

In order to clearly illustrate the technical solutions of the embodiments of the invention, the drawings of the embodiments will be briefly described in the following; it is obvious that the described drawings are only related to some embodiments of the invention and thus are not limitative of the invention.

DETAILED DESCRIPTION OF THE PREFERRED EMBODIMENTS

In order to make objects, technical details and advantages of the embodiments of the invention apparent, the technical solutions of the embodiments will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

In the embodiments of the invention, during manufacturing a TFT-LCD array substrate, after completion of a substrate which comprises a pattern of a gate scan line, a thin film transistor (TFT), a data line, a pixel electrode and a board wiring PAD region, a first passivation layer is formed, and a PAD-region via hole is formed on the PAD region through a first patterning process; then, a second passivation layer is subsequently formed, and a pixel-region via hole in a regular trapezoidal shape with an opening smaller than its bottom edge is formed through a second patterning process; finally, a transparent conductive layer is directly applied, and a common electrode with a comb-like slim structure is naturally formed due to the step of the regular trapezoidal pixel-region via hole. Thus, the pixel-region via hole is present in the passivation layer between the pixel electrode and the common electrode; since the pixel-region via hole is in a regular trapezoidal shape with the opening smaller than its bottom edge, no residues of the pixel electrode will be caused, thereby improving the yield of the array substrate.

Figure 1A:
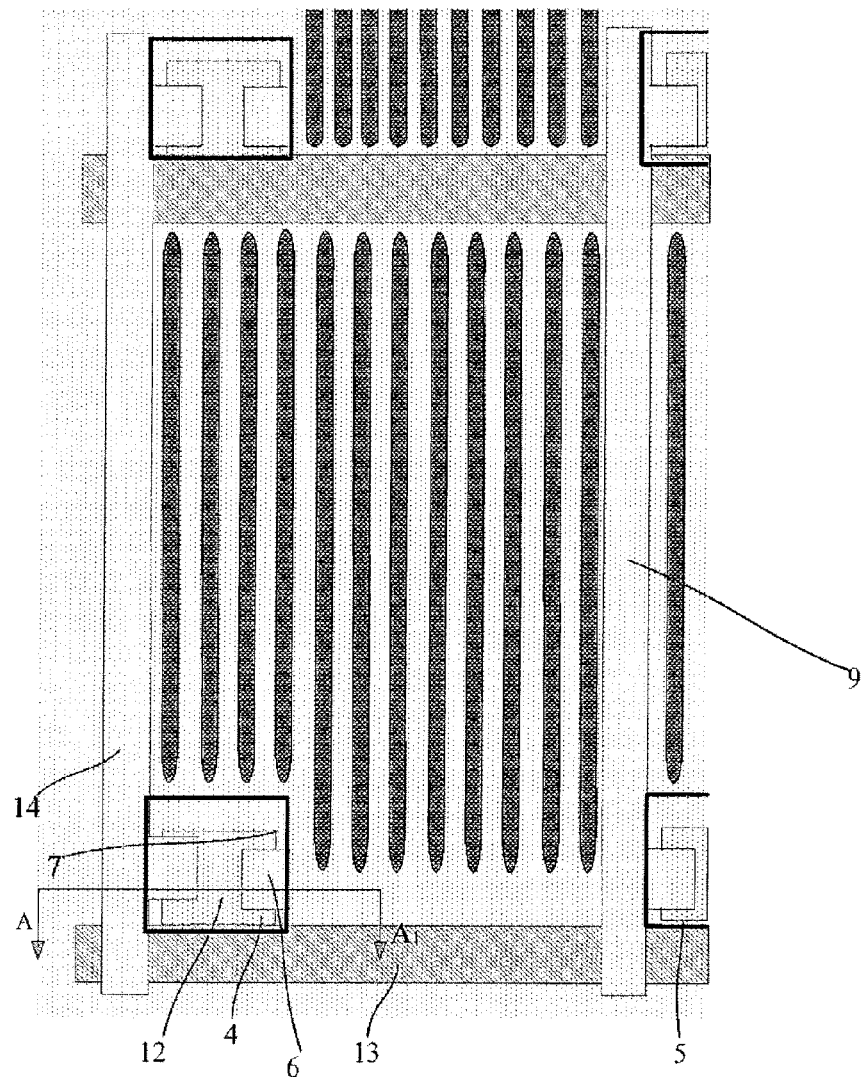
FIG. 1(a) is a schematic structural diagram of an array substrate in the prior art.
Figure 1B:
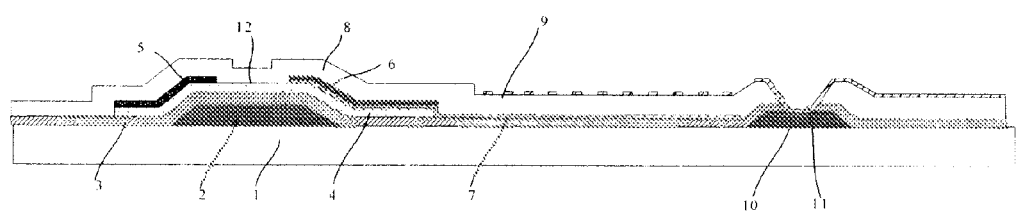
FIG. 1(b) is a sectional view of FIG. 1(a), taken along A-A$_1$ direction.
Figure 2:
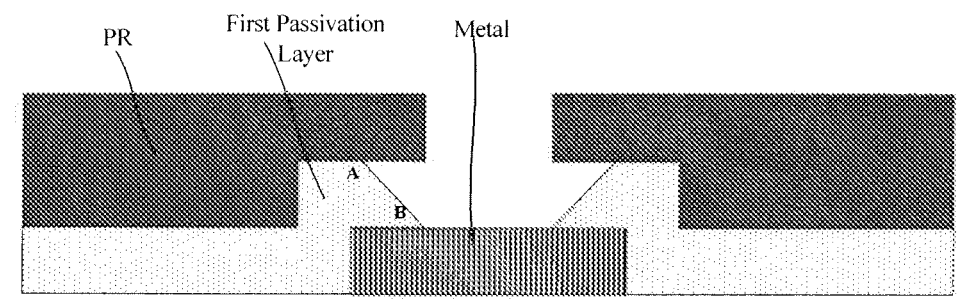
FIG. 2 is a schematic diagram of a via hole formed by dry-etching a first passivation layer in an embodiment of the present invention.

With reference to FIG. 2, in an embodiment of the invention, a manufacturing procedure of a TFT array substrate comprises the following steps.

Step 201: a substrate is manufactured, which comprises patterns of a gate scan line, a thin film transistor (TFT), a data line, a pixel electrode and a board wiring PAD region.

Here, several times of patterning process may be used to manufacture the substrate which comprises the patterns of the gate scan line, the thin film transistor (TFT), the data line, the pixel electrode and the board wiring PAD region.

A first scheme is: S1, patterns of a gate electrode of the TFT, a gate scan line and a board wiring PAD region are formed on a base substrate.

Here, the patterns of the gate electrode, the gate scan line and the board wiring PAD region may be formed as follows: a gate metal layer is formed on a base substrate by depositing, coating or sputtering, and then is subject to a patterning process, that is, applying photoresist, exposing with a mask, developing, thereafter etching, and finally removing the photoresist.

S2, a pattern of an active layer is formed on the substrate comprising the pattern of the gate scan line.

The pattern of the active layer is formed as follows: a gate insulating layer and an active layer are formed on the substrate comprising the gate scan line by depositing, coating or oxidizing, and then are subject to a patterning process, that is, applying photoresist, exposing with a mask, developing, thereafter etching, and finally removing the photoresist.

S3, a pattern of a pixel electrode is formed on the substrate comprising the pattern of the active layer.

The pattern of the pixel electrode is formed as follows: a pixel-electrode metal layer is formed on the substrate comprising the active layer by depositing, coating or sputtering, and then is subject to a patterning process.

S4, patterns of a source electrode, a drain electrode and a TFT channel of the TFT as well as a data line are formed on the substrate comprising the pixel electrode.

That is, the patterns of the source electrode, the drain electrode and the TFT channel of the TFT as well as the data line are formed as follows: a data-line metal layer is formed on the substrate comprising the pixel electrode by depositing or sputtering, and then is subject to a patterning process.

A second scheme is: patterns of a gate electrode of the TFT, a gate scan line and a board wiring PAD region are formed on a base substrate; patterns of an active layer, a source electrode, a drain electrode and a TFT channel of the TFT as well as a data line are formed on the substrate comprising the pattern of the gate scan line; a pattern of a pixel electrode is formed on the substrate comprising the pattern of the data line. A specific procedure according to this scheme can also be accomplished through patterning processes. The details thereof are not specifically described here.

Certainly, it is also possible to accomplish the manufacture of the above-described substrate which comprises patterns of the gate scan line, the thin film transistor (TFT), the data line, the pixel electrode and the board wiring PAD region by using the prior art.

Step 202: a first passivation layer is formed on the substrate, and a board wiring PAD-region via hole is formed through a first patterning process.

Specifically, the first patterning process comprises: applying photoresist on the first passivation layer, exposing with a first mask, and developing; then, dry-etching the first passivation layer not covered with the photoresist, so as to form the board wiring PAD-region via hole.

In the embodiment of the invention, preferably, the PAD-region via hole is an inverted trapezoidal via hole with an opening larger than its bottom edge.

Dry-etching is a film-etching technology using plasma. Such a type of etching is a combination of physical etching and chemical etching, in which, the physical etching mainly proceeds in a vertical direction, and the chemical etching mainly proceeds in a transverse direction. As illustrated in FIG. 2, photoresist is applied on the first passivation layer, exposed with a first mask, and subject to a developing processing; then, when the first passivation not covered with the photoresist is etched by dry-etching, since the first passivation layer at point A has a longer time for being in contact with plasma than the first passivation layer at point B, the passivation layer will be indented transversely under the effect of chemical etching, and eventually an inverted trapezoidal PAD-region via hole is formed, as illustrated in FIG. 2; the PAD-region via hole has an opening larger than its bottom edge. That is, the cross-section of the PAD-region via hole, taken along a direction perpendicular to a surface of the substrate, has a shape of an inverted trapezoid with an upper-base larger than its lower-base.

Step 203: a second passivation layer is formed on the substrate formed with the board wiring PAD-region via hole, and a pixel-region via hole is formed through a second patterning process.

Here, the second passivation layer is a film layer denser than the first passivation layer; for purpose of explanation, with a chemical vapor deposition method as an example, the process temperature for forming the second passivation layer is lower than the process temperature for forming the first passivation layer, that is, formation temperature of the second passivation layer is lower than the formation temperature of the first passivation layer; therefore, the second passivation layer is denser, that is, the density of the material of the second passivation layer is greater than the density of the material of the first passivation layer; thus, the etching rate of the second passivation layer is less than the etching rate of the first passivation layer. Certainly, it is also possible to change other process parameters, such as pressure, or composite proportion of the passivation layer, to make the etching rate of the second passivation layer be less than the etching rate of the first passivation layer.

Figure 3:
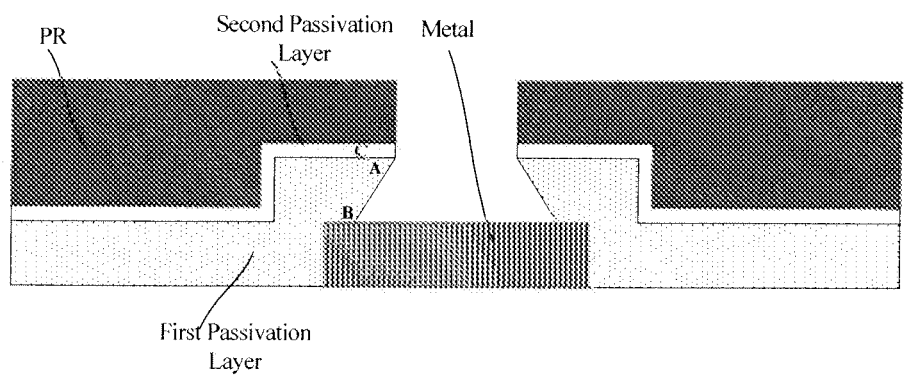
FIG. 3 is a schematic diagram of a via hole formed by dry-etching a second passivation layer and a first passivation layer in an embodiment of the present invention.

Thus, a specific procedure comprises: applying photoresist on the second passivation layer, exposing with a second mask, and performing a developing processing; then etching the second passivation layer not covered with the photoresist as well as the first passivation layer underneath by a dry etch method, so as to form a pixel-region via hole. Generally, the depth of the pixel-region via hole is less than or equal to the sum of the thickness of the first passivation layer and the thickness of the second passivation layer. As illustrated in FIG. 3, during dry-etching, the etching rate at point C is the smallest, while the etching rate relationship is C<A=B; because the etching rate at point C is small whereas the etching rate at point A and point B is relatively large, eventually, a regular trapezoidal pixel-region via hole is formed, and the pixel-region via hole has an opening smaller than its bottom edge.

The passivation layer comprises the first passivation layer and the second passivation layer, and the passivation layer may have a plurality of regular trapezoidal pixel-region via holes formed therein. That is, the pixel-region via hole each has a top-size smaller than its bottom-size. As can be seen in connection with FIG. 9(*a*) and FIG. 9(*b*), in a plan view, the pixel-region via hole each is in a strip-shape extending along at least one direction. As can be understood from the description as below, the pixel-region via hole here is used to form a slit-structure for the common electrode to be formed thereabove. Therefore, the pixel-region via holes are provided corresponding to the slit-structures for the common electrode to be formed thereabove. Accordingly, the strip-shape of the pixel-region via holes may extend along one, two or more directions, so as to form a slit-structure extending along the corresponding direction. As can be seen from FIG. 9(*b*), the cross-section of each of the pixel-region via holes, perpendicular to the extending direction of the strip-shape, has a shape of a regular trapezoid with an upper-base smaller than its lower-base.

In the process of etching and forming the pixel-region via hole, the second passivation layer within the PAD-region via hole is also required to be etched; because only the second passivation layer and the gate insulating layer are within the PAD-region via hole, and because the second passivation layer is relatively thin with respect to the first passivation layer, the thickness of the first passivation layer is usually 200-900 nm, while the thickness of the second passivation layer is usually 5-100 nm, no regular trapezoidal via hole will be formed; moreover. The inverted trapezoidal PAD-region via hole will not cause the problem of broken-line during a subsequent formation of a common-electrode ITO thin film.

Step 204: a transparent conductive layer is applied on the substrate formed with the pixel-region via hole, so as to form a common electrode.

Figure 10A:
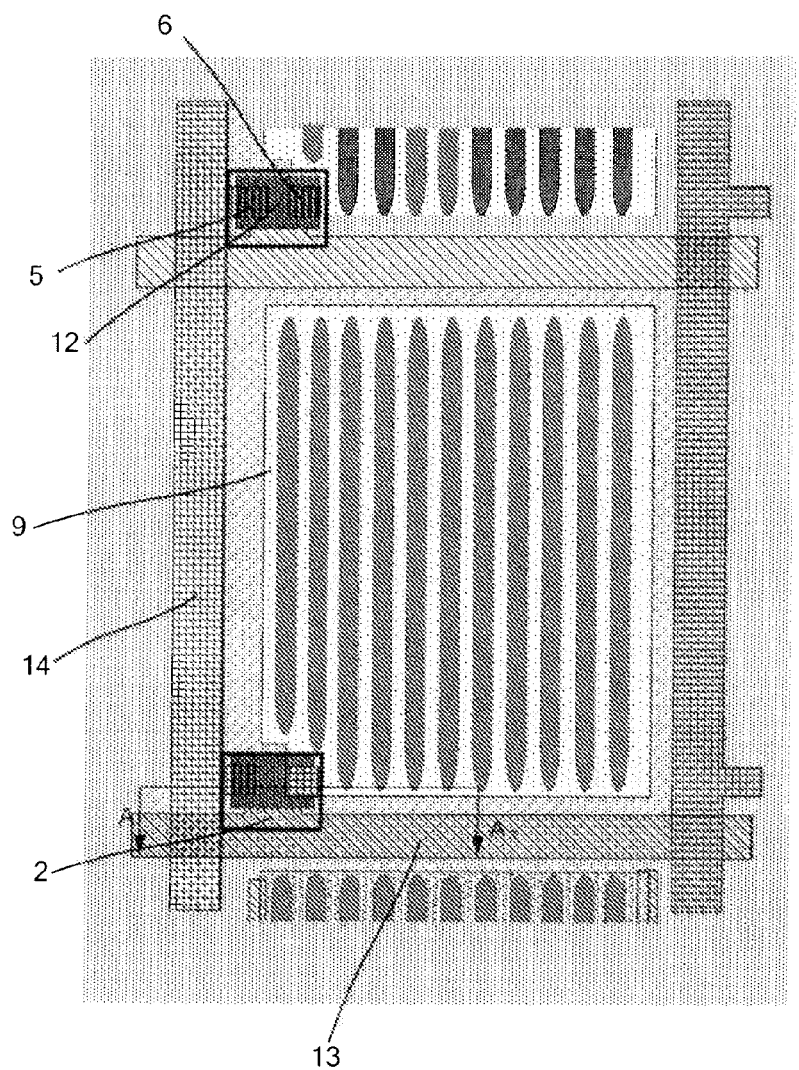
FIG. 10(a) is a schematic diagram of a substrate formed with a pattern of a common electrode in a specific embodiment of the present invention.
Figure 10B:
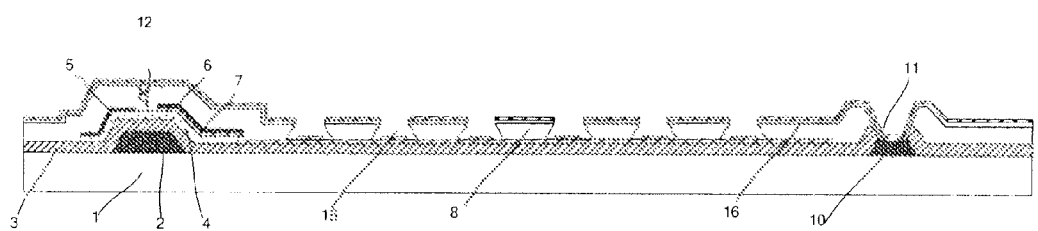
FIG. 10(b) is a sectional view of FIG. 10(a), taken along A-A$_1$ direction.

Since the pixel-region via hole on the passivation layer is in a regular trapezoidal shape with an opening smaller than its bottom edge, after a transparent conductive layer is applied on the passivation layer which has a step formed by the pixel-region via hole, a common electrode can be directly formed, without the need of a patterning process. Specifically, the common electrode may be formed, by depositing, coating, or sputtering a transparent conductive layer on the passivation layer. As illustrated in FIG. 10(*b*), the transparent conductive layer is discontinued at the location of the pixel-region via hole, so as to form a common electrode having a slit-structure. Moreover, the slit-structure is provided corresponding to the pixel-region via hole.

Through the above processes, an array substrate can be formed, and the array substrate comprises:

A gate scan line, a thin film transistor (TFT), a data line, a pixel electrode, a common electrode, a board wiring PAD region, and a PAD-region via hole, in which, A Pixel-region via hole is present in the passivation layer between the pixel electrode and the common electrode, in which, the passivation layer comprises a first passivation layer and a second passivation layer, and the pixel-region via hole is a regular trapezoidal via hole with an opening smaller than its bottom edge.

In the embodiment of the invention, the gate metal layer may specifically be a single-layer film of AlNd, Al, Cu, Mo, MoW or Cr, alternatively may be a composite film composed of any one from AlNd, Al, Cu, Mo, MoW or Cr or any combination thereof; the gate insulating layer may specifically be a single-layer film of SiNx, SiOx or SiOxNy, alternatively may be any one from SiNx, SiOx or SiOxNy or any combination thereof. The data-line metal layer may specifically be a single-layer film of Mo, MoW or Cr, alternatively may be a composite film composed of any one from Mo, MoW or Cr or any combination thereof; the passivation layer is a composite film composed of any one from SiNx, SiOx or SiOxNy or any combination thereof. The metal layer of the common electrode and the pixel electrode may be a composite film composed of any one from ITO, IZO or a combination thereof.

As can be known from the manufacturing procedure described above, after the PAD-region via hole is formed, a patterning process is added to form the pixel-region via hole in the passivation layer, and then the common-electrode metal layer is formed, so that the common electrode is directly formed without the need of patterning process. Therefore, as compared with the prior art, there is no increase in number of patterning process, which means there is no increase in process costs. But, because of the passivation layer formed with the pixel-region via hole, and because of the regular trapezoidal pixel-region via hole formed due to the etching rate of the second passivation layer less than the etching rate of the first passivation layer, no residues of the common electrode will be produced, which facilitates the process control, and eventually improves the product quality.

Since the depth of the pixel-region via hole is less than or equal to the sum of the thickness of the first passivation layer and the thickness of the second passivation layer, that is, the depth of the pixel-region via hole is less than or equal to the thickness of the passivation layer; preferably, when the depth of the pixel-region via hole is equal to the thickness of the passivation layer, a part of the deposited pixel-electrode metal layer will be directly overlaid on the pixel electrodes, which also helps to reduce sheet resistance of the pixel electrode, and helps to improve image quality.

Hereinafter, the embodiment of the present invention will be described in further detail in connection with the drawings.

In this embodiment, a drain electrode of a TFT is located above a first pixel electrode, and the depth of a pixel-region via hole is equal to the thickness of a passivation layer. A manufacturing procedure of the array substrate comprises the following steps.

Step 501: a gate metal layer is deposited on a substrate 1, and patterns of a gate electrode 2 of a TFT, a gate scan line 13 and a board wiring PAD region 10 are formed through a patterning process.

Figure 4A:
FIG. 4(a) is a schematic diagram of a substrate formed with a pattern of a gate scan line in a specific embodiment of the present invention.
Figure 4A:
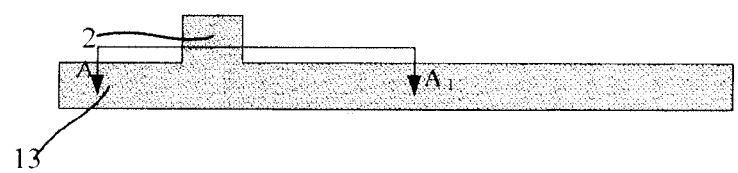
Figure 4B:
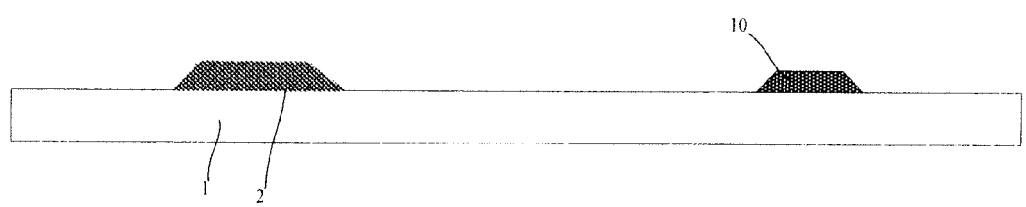
FIG. 4(b) is a sectional view of FIG. 4(a), taken along A-A$_1$ direction.

The formed patterns are illustrated in FIG. 4(*a*), of which a section along A-A$_1$ direction is illustrated in FIG. 4(*b*).

Step 502: a gate insulating layer 3 and an active material are deposited on the substrate 1 comprising the gate scan line 13, and an active layer 4 is formed through a patterning process.

Figure 5A:
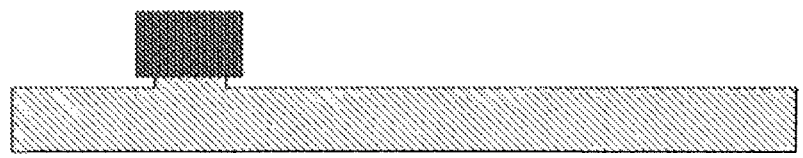
FIG. 5(a) is a schematic diagram of a substrate formed with a pattern of an active layer in a specific embodiment of the present invention.
Figure 5A:
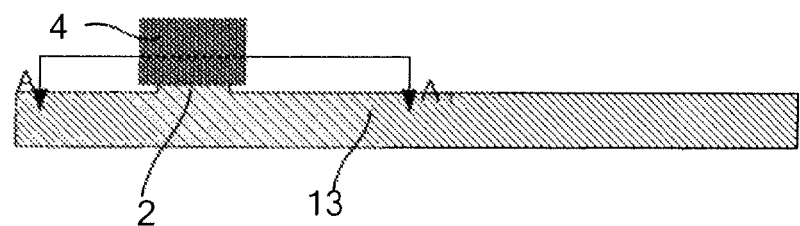
Figure 5B:
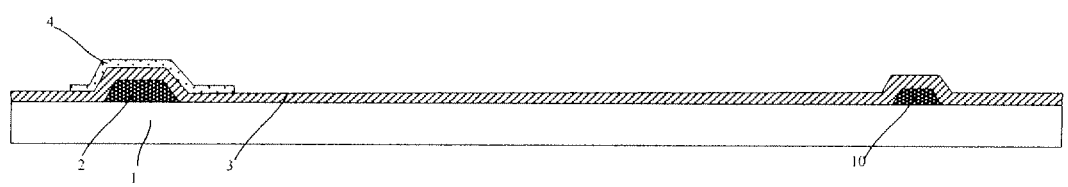
FIG. 5(b) is a sectional view of FIG. 5(a), taken along A-A$_1$ direction.

The formed pattern is illustrated in FIG. 5(*a*), of which a section along A-A$_1$ direction is illustrated in FIG. 5(*b*).

Step 503: a pixel-electrode metal layer is deposited on the substrate 1 comprising the active layer 4, and a pixel electrode 7 is formed through a patterning process.

Figure 6A:
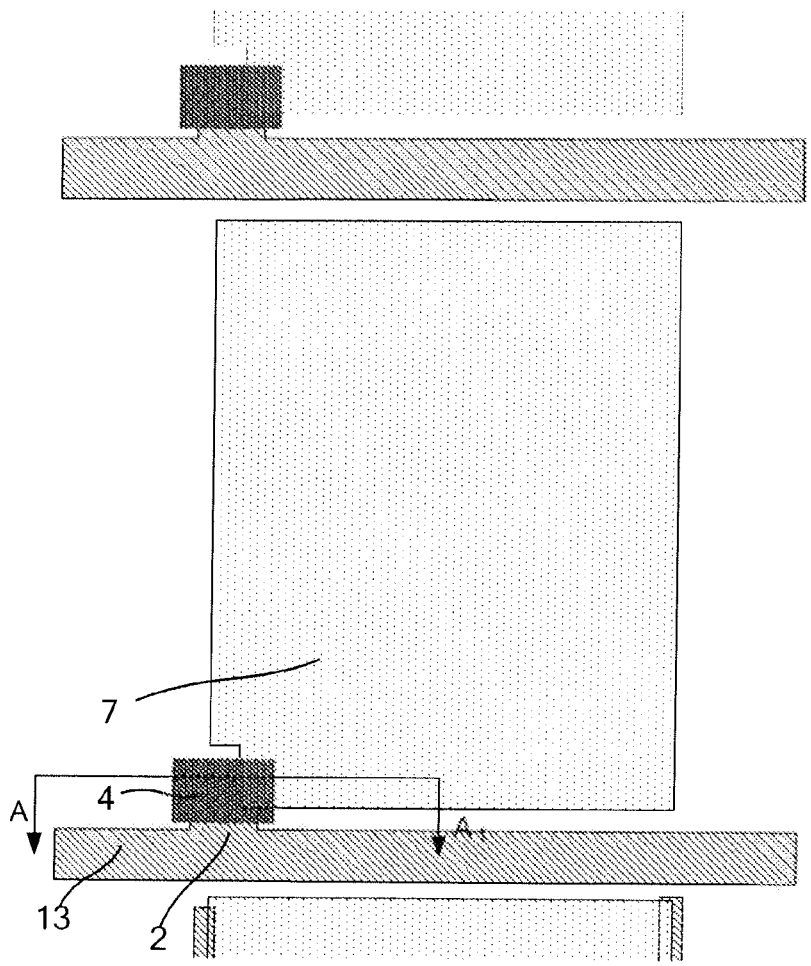
FIG. 6(a) is a schematic diagram of a substrate formed with a pattern of pixel electrodes in a specific embodiment of the present invention.
Figure 6B:
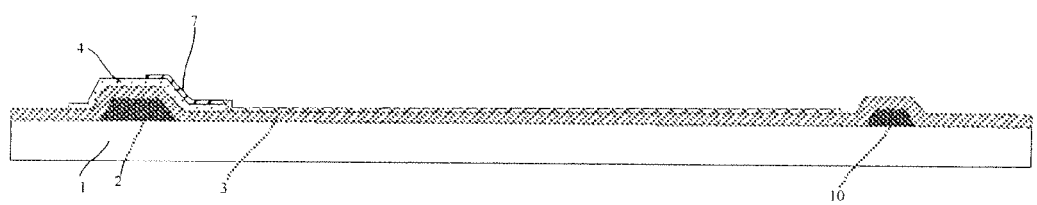
FIG. 6(b) is a sectional view of FIG. 6(a), taken along A-A$_1$ direction.

The formed pattern is illustrated in FIG. 6(*a*), of which a section along A-A$_1$ direction is illustrated in FIG. 6(*b*).

Step 504: a data-line metal layer is deposited on the substrate 1 comprising the pixel electrodes 7, and a source electrode 5, a drain electrode 6 and a TFT channel 12 of the TFT, as well as a data line 14, are formed through a patterning process.

Figure 7A:
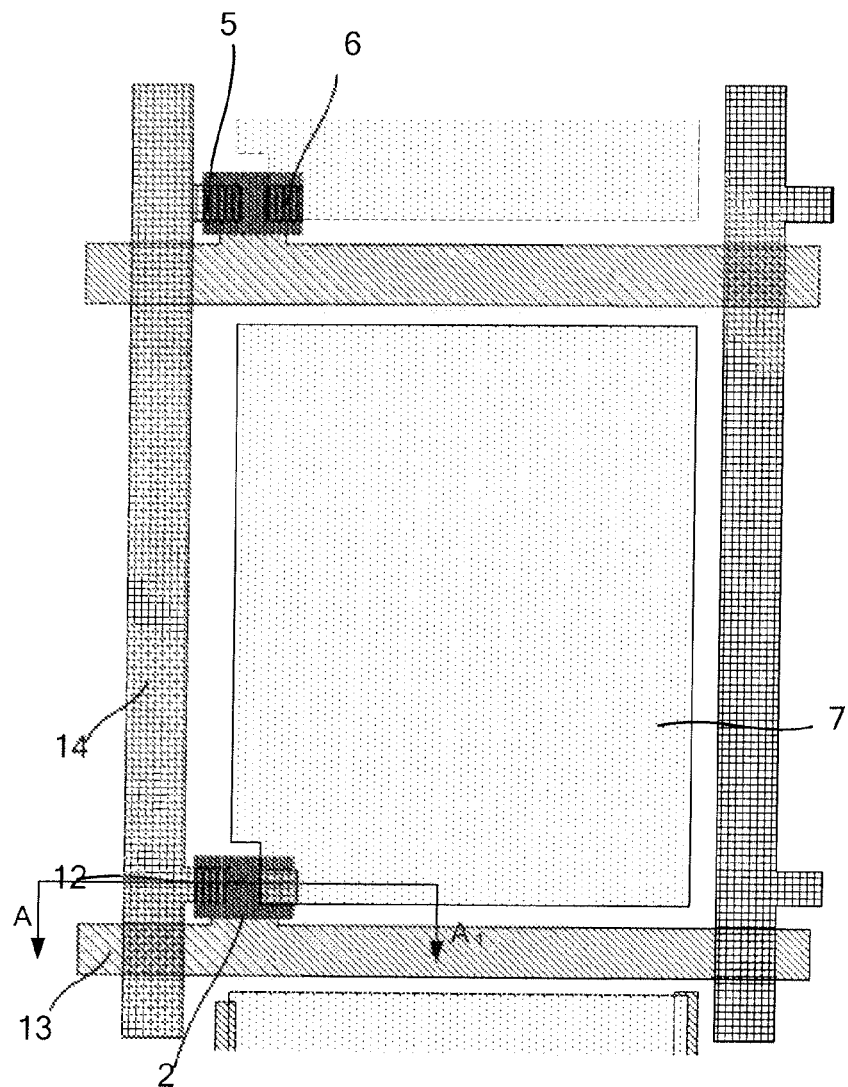
FIG. 7(a) is a schematic diagram of a substrate formed with a pattern of a data line in a specific embodiment of the present invention.
Figure 7B:
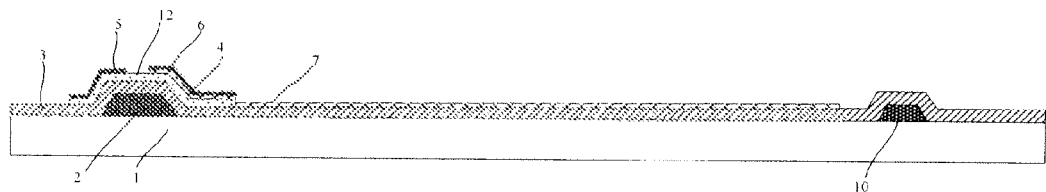
FIG. 7(b) is a sectional view of FIG. 7(a), taken along A-A$_1$ direction.

The formed patterns are illustrated in FIG. 7(*a*), of which a section along A-A$_1$ direction is illustrated in FIG. 7(*b*).

Step 505: a first passivation layer 8 is deposited on the substrate 1 comprising the data line 14, and a board wiring PAD-region via hole 11 is formed through a patterning process.

Figure 8A:
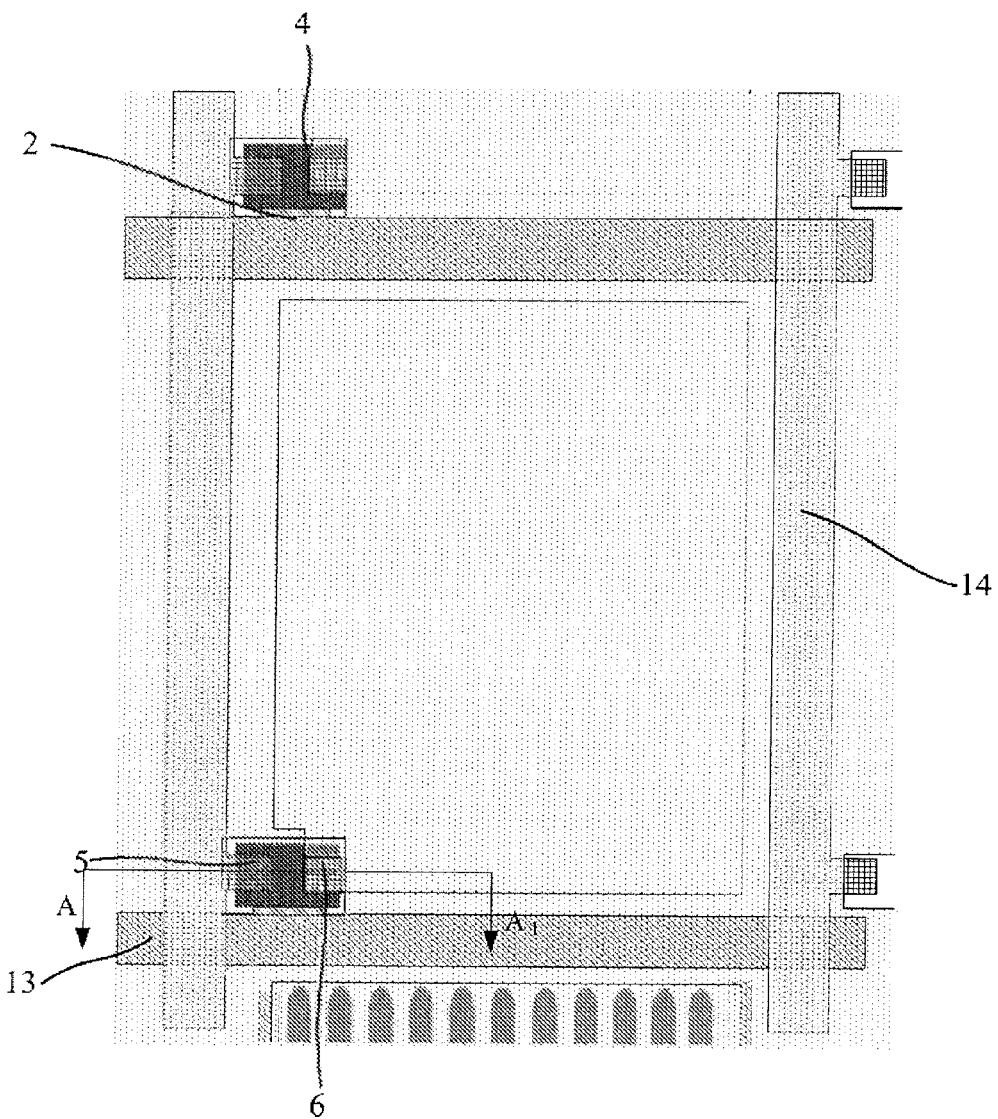
FIG. 8(a) is a schematic diagram of a substrate formed with a pattern of a PAD-region via hole in a specific embodiment of the present invention.
Figure 8B:
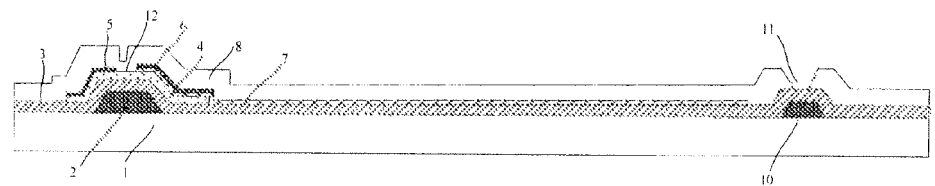
FIG. 8(b) is a sectional view of FIG. 8(a), taken along A-A$_1$ direction.

The formed pattern is illustrated in FIG. 8(*a*), of which a section along A-A$_1$ direction is illustrated in FIG. 8(*b*). In this patterning process, a dry etch method is adopted, and the PAD-region via hole 11 such formed has an inverted trapezoidal structure, with an opening larger than its bottom edge.

Step 506: a second passivation layer 16 is deposited on the substrate 1 comprising the PAD-region via hole 11, and a pixel-region via hole 15 is formed through a patterning process,.

Figure 9A:
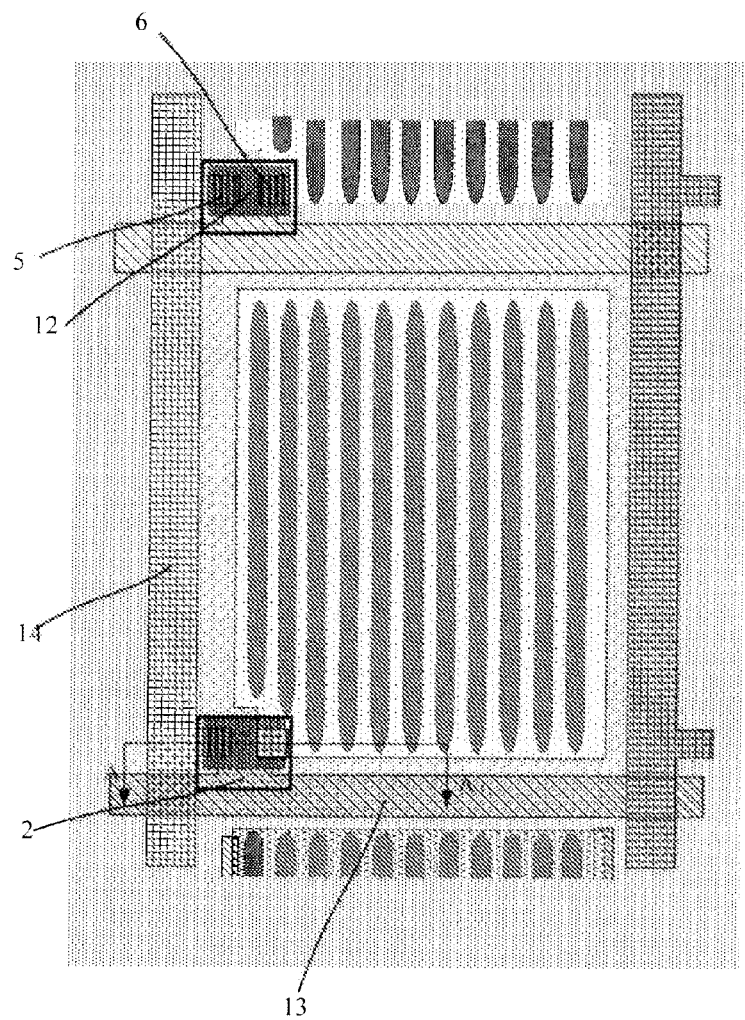
FIG. 9(a) is a schematic diagram of a substrate formed with a pattern of a pixel-region via hole in a specific embodiment of the present invention.
Figure 9B:
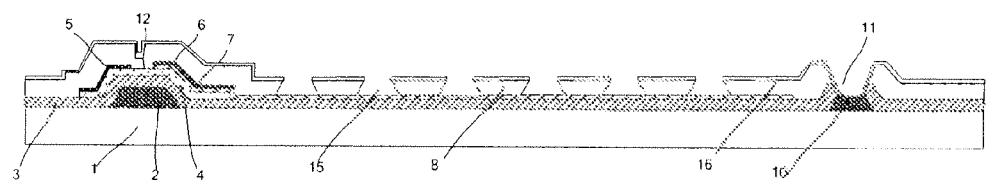
FIG. 9(b) is a sectional view of FIG. 9(a), taken along A-A, direction.

The temperature for depositing the second passivation layer 16 should be lower than the temperature for depositing the first passivation layer 8, thus, in a patterning process, during dry-etching, the etching rate of the second passivation layer is less than the etching rate of the first passivation layer. Resultantly, the formed pattern is illustrated in FIG. 9(*a*), of which a section along A-A$_1$ direction is illustrated in FIG. 9(*b*). The pixel-region via hole 15 has a regular trapezoidal structure, with an opening smaller than its bottom edge. Moreover, the depth of the via hole 15 is equal to the thickness of the passivation layer, that is, the sum of the thickness of the first passivation layer 8 and the thickness of the second passivation layer 16 is equal to the depth of the pixel-region via hole 15; meanwhile, the second passivation layer 16 within the PAD-region via hole also needs to be etched, and because only the second passivation layer 16 and the gate insulating layer 3 are within the PAD-region via hole, and because the second passivation layer 16 is relatively thin with respect to the first passivation layer 8, no regular trapezoidal via hole will be formed; moreover, the inverted trapezoidal PAD-region via hole will not cause the problem of broken-line during a subsequent formation of a common-electrode ITO thin-film.

Step 507: a transparent conductive layer is formed on the substrate 1 formed with the pixel-region via hole 15, so as to form a common electrode 9.

Because of the pixel-region via hole 15 with a regular trapezoidal structure, the passivation layer has a step, after a pixel-electrode metal layer is deposited, a common electrode 9 can be directly formed. The formed pattern is illustrated in FIG. 10(*a*), of which a section along A-A$_1$ direction is illustrated in FIG. 10(*b*).

As illustrated in FIG. 10(*a*) and FIG. 10(*b*), the array substrate such formed is different from an existing array substrate in that: in this embodiment, the passivation layer on the array substrate has a pixel-region via hole 15 formed therein, and the common electrode 9 covers the entire substrate, however, it is sectioned due to the passivation layer has a step, no residues of the common electrode 9 will be produced, thereby improving the yield of the array substrate.

Further, in this embodiment, the sum of the thickness of the first passivation layer 8 and the thickness of the second passivation layer 16 is equal to the depth of the pixel-region via hole 15, and during formation of the common electrode, the pixel electrode at the location of the via hole will be covered with a transparent conductive layer, which helps to reduce sheet resistance of the pixel electrode 7, and helps to improve the image quality.

The array substrate in the embodiment of the present invention may be applied in a thin film transistor display device. The display device may be: a LCD panel, an e-paper, an OLED panel, a LCD TV, a LCD monitor, a digital photo frame, a mobile phone, a tablet computer and any other product or part with a display function.

In the embodiment of the present invention, a first passivation layer is formed on a substrate which has been formed thereon with patterns of a gate scan line, a thin film transistor (TFT), a data line, a pixel electrode and a board wiring PAD regions, and a board wiring PAD-region via hole is formed through a first patterning process; a second passivation layer is formed on the substrate formed with the board wiring PAD-region via hole, and a pixel-region via hole is formed through a second patterning process. The pixel-region via hole is a regular trapezoidal via hole with an opening smaller than its bottom edge; a transparent conductive layer is formed on the substrate formed with the pixel-region via hole, so as to form a common electrode; thus, the manufacture of the array substrate is accomplished. Because of the passivation layer formed with a step, and generally the thickness of the passivation layer is ten times of the thickness of the pixel electrode, thus, after the regular trapezoidal pixel-region via hole is formed, the high step ensures no residues of the common electrode, which facilitates the process control, and eventually improves the product quality.

Further, when the depth of the pixel-region via hole is equal to the thickness of the passivation layer, a part of the deposited pixel-electrode metal layer will be directly overlaid on the pixel electrode, which also helps to reduce sheet resistance of the pixel electrode, and helps to improve the image quality.

The above has described, by way of example, an example in which the display electrode below a passivation layer is a pixel electrode and the display electrode above the passivation layer is a common electrode; however, the display electrode below the passivation layer may also be a common electrode, and the electrode above the passivation layer may also be a pixel electrode. In such a case, it is only needed to change the connection relationships between the upper electrode, the lower electrode and the thin-film transistor, the board wiring PAD region, which is not specifically described here.

The above description is only exemplary implementations of the present invention, but not for limiting the scope of the invention; instead, the scope of the invention should be defined by the appended claims.

What is claimed is:

1. A manufacturing method of a thin film transistor array substrate, comprising:
    forming a first passivation layer on a substrate formed with a gate scan line, a thin film transistor, a data line, a first display electrode and a board wiring PAD region, and forming a board wiring PAD-region via hole in the first passivation layer above the board wiring PAD region through a first patterning process;
    forming a second passivation layer on the substrate formed with the board wiring PAD-region via hole, and forming a pixel-region via hole in the first passivation layer and the second passivation layer above the first display electrode through a second patterning process in such a way that the pixel-region via hole has a top-size smaller than its bottom-size; and
    applying a transparent conductive layer on the substrate formed with the pixel-region via hole to form a second display electrode,
    wherein the pixel-region via hole is formed at a region other than the thin film transistor, and
    wherein, for cross sections of the pixel-region via hole taken along a direction parallel to the substrate, an area of cross sections away from the substrate is smaller than an area of cross sections closer to the substrate.

2. The method according to claim 1, wherein, as seen in a plan view, the pixel-region via hole is in a strip-shape extending along at least one direction; and
    wherein a cross-section of the pixel-region via hole perpendicular to the extending direction of the strip-shape has a shape of a regular trapezoid with an upper-base smaller than its lower-base.

3. The method according to claim 2, wherein in the step of applying the transparent conductive layer on the substrate formed with the pixel-region via hole, the transparent conductive layer is discontinued at a location of the pixel-region via hole, so as to form the second display electrode having a slit-structure.

4. The method according to claim 1, wherein the first display electrode is a pixel electrode, and the second display electrode is a common electrode.

5. The method according to claim 1, wherein the cross-section of the PAD-region via hole, taken along a direction perpendicular to a surface of the substrate, has a shape of an inverted trapezoid with an upper-base larger than its lower-base.

6. The method according to claim 1, wherein the step of forming the board wiring PAD-region via hole through the first patterning process comprises:
    applying photoresist on the first passivation layer, exposing with a first mask, and performing a developing processing; and
    etching the first passivation layer not covered with the photoresist by a dry etch method, so that the board wiring PAD-region via hole is formed.

7. The method according to claim 6, wherein in the second patterning process, the second passivation layer above the board wiring PAD-region via hole further has a via hole formed therein.

8. The method according to claim 1, wherein the step of forming the pixel-region via hole through the second patterning process comprises:
    applying photoresist on the second passivation layer, exposing with a second mask, and performing a developing processing; and
    etching the second passivation layer not covered with the photoresist and the first passivation layer therebelow by a dry etch method, so that the pixel-region via hole are formed.

9. The method according to claim 1, wherein a depth of the pixel-region via hole is less than or equal to a sum of a thicknesses of the first passivation layer and a thickness of the second passivation layer.

10. The method according to claim 1, wherein in the second patterning process, an etching rate of the second passivation layer is less than an etching rate of the first passivation layer.

11. The method according to claim 10, wherein a formation temperature of the second passivation layer is lower than that of the first passivation layer.

12. The method according to claim 1, wherein a procedure of forming the gate scan line, the thin film transistor, the data line, the first display electrode and the board wiring PAD region comprises:
    forming a gate electrode of the thin film transistor, the gate scan line, and the board wiring PAD region on the substrate;

forming a semiconductor active layer, the data line, and a source electrode and a drain electrode of the thin film transistor on the substrate formed with the gate electrode; and forming the first display electrode on the substrate formed with the source electrode and the drain electrode.

13. The method according to claim 1, wherein a procedure of forming the gate scan line, the thin film transistor, the data line, the first display electrode and the board wiring PAD region comprises:

forming a gate electrode of the thin film transistor, the gate scan line, and the board wiring PAD region on the substrate;

forming a semiconductor active layer on the substrate formed with the gate electrode;

on the substrate formed with the semiconductor active layer, forming the first display electrode; and forming the data line, and a source electrode and a drain electrode of the thin film transistor on the substrate formed with the first display electrode.

* * * * *